(12) United States Patent
Mitchell et al.

(10) Patent No.: US 7,352,191 B2
(45) Date of Patent: Apr. 1, 2008

(54) SENSOR ASSEMBLY AND METHOD OF FORMING THE SAME

(75) Inventors: Charles Mitchell, Austin, TX (US); Sywong Ngin, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 11/098,322

(22) Filed: Apr. 4, 2005

(65) Prior Publication Data

US 2006/0220657 A1    Oct. 5, 2006

(51) Int. Cl.
*G01R 27/08* (2006.01)

(52) U.S. Cl. .............. 324/609; 324/691; 324/693; 340/561

(58) Field of Classification Search .......... 324/609; 340/561
See application file for complete search history.

(56) References Cited

U.S. PATENT DOCUMENTS

| | | | |
|---|---|---|---|
| 4,185,162 A * | 1/1980 | Bogese, II | 174/32 |
| 4,481,815 A | 11/1984 | Overton | |
| 4,862,743 A | 9/1989 | Seitz | |
| 5,000,893 A * | 3/1991 | West et al. | 264/46.5 |
| 5,010,774 A | 4/1991 | Kikuo et al. | |
| 5,802,715 A * | 9/1998 | O'Neill | 29/869 |
| 5,936,412 A | 8/1999 | Gershenfeld et al. | |
| 5,939,190 A * | 8/1999 | Pfaff et al. | 428/344 |
| 6,116,778 A * | 9/2000 | Faust et al. | 374/109 |
| 6,310,407 B1 | 10/2001 | Saito et al. | |
| 6,392,542 B1 * | 5/2002 | Stanley | 340/561 |
| 6,412,265 B1 * | 7/2002 | Yamamoto et al. | 57/242 |
| 6,424,268 B1 | 7/2002 | Isonaga et al. | |
| 6,643,925 B1 | 11/2003 | Ormachea et al. | |
| 6,646,452 B2 * | 11/2003 | Lester | 324/661 |
| 6,683,583 B2 | 1/2004 | Ngin | |
| 6,744,370 B1 * | 6/2004 | Sleichter et al. | 340/576 |
| 6,812,898 B2 * | 11/2004 | Doub et al. | 343/702 |
| 6,840,117 B2 * | 1/2005 | Hubbard, Jr. | 73/862.041 |
| 6,906,534 B2 * | 6/2005 | Hoisington et al. | 324/694 |
| 2003/0094959 A1 | 5/2003 | Hoisington et al. | |
| 2003/0158643 A1 * | 8/2003 | Murphy et al. | 701/45 |
| 2004/0043696 A1 * | 3/2004 | Suzuki | 446/268 |
| 2004/0199318 A1 | 10/2004 | Shieh et al. | |
| 2004/0250602 A1 * | 12/2004 | Leverrier et al. | 73/31.05 |

FOREIGN PATENT DOCUMENTS

| | | |
|---|---|---|
| DE | 19719455 A1 | 11/1998 |
| FR | 2 488 739 | 2/1982 |

* cited by examiner

*Primary Examiner*—Andrew H. Hirshfeld
*Assistant Examiner*—John Zhu
(74) *Attorney, Agent, or Firm*—John A. Burtis (57) ABSTRACT

A sensor assembly includes a sensing element electrically connected to a conductor of a flexible multiconductor cable using a conductive patch, which is electrically connected to the conductor. A method of forming a sensor assembly includes electrically connecting an electrically conductive patch to a sensing element and electrically connecting a conductor of a multiconductor cable to the electrically conductive patch.

26 Claims, 7 Drawing Sheets

SENSOR ASSEMBLY AND METHOD OF FORMING THE SAME

BACKGROUND

The present invention relates to a sensor assembly. More particularly, the present invention relates to a sensor assembly including a sensing element connected to a conductor of a multiconductor cable using a conductive patch. In addition, the present invention relates to a method of forming a sensor assembly.

Sensor assemblies may be used to monitor the position, orientation, presence, or size of a person or object within a defined space. The position, orientation, presence, or size of a person or object in the defined space may affect the impedance around a sensing element of a sensor assembly. A current may be applied to one or more sensors, and an electronic control unit ("ECU") may measure the impedance changes in an electric field around each sensing element in order to gather information about the position, orientation, presence, or size of a person. For example, a sensor assembly may be used in a vehicle seat to help regulate the deployment of air bags.

A sensor assembly generally includes an array of electrode sensors (or other suitable sensing elements) arranged about the defined space, where each sensor is electrically connected to the ECU. Each sensor is typically connected to the ECU using a conductive wire which is electrically connected to the sensor using an eyelet and rivet securing means or by "crimping" the sensor and wire together. Typically, there is one discrete conductive wire per sensor, and so each sensor assembly has multiple, but separate, conductive wires. When used in a vehicle seat, the sensors may be attached to a flexible pad material, such as a polyurethane foam mat, which may then be used to form part of the vehicle seat.

BRIEF SUMMARY

In a first aspect, the present invention is a sensor assembly including a sensing element, an electrically conductive patch electrically connected to the sensing element, and a cable including a plurality of conductors. The electrically conductive patch is positioned between the cable and the sensing element. A conductor of the cable is electrically connected to the electrically conductive patch.

In a second aspect, the present invention is a sensor mat assembly including a pad material, a first sensing element electrically connected to a first electrically conductive patch on a first side of the pad material, a second sensing element electrically connected to a second electrically conductive patch on a second side of the pad material, and a flat cable. The first and second sides of the pad material oppose one another. The flat cable includes a first conductor and a second conductor. The first conductor is electrically connected to the first electrically conductive patch and the second conductor is electrically connected to the second electrically conductive patch.

In a third aspect, the present invention is a method of forming a sensor assembly. The method includes electrically connecting an electrically conductive patch to a sensing element and electrically connecting a longitudinally-extending conductor of a multiconductor cable to the electrically conductive patch, thereby forming an electrical connection between the conductor and the sensing element.

In a fourth aspect, the present invention is a method of forming a sensor mat assembly. The method includes providing a first sensing element, electrically connecting a first electrically conductive patch to the first sensing element, electrically connecting a first conductor of a multiconductor cable to the first electrically conductive patch, securing at least part of a first side of a pad material to the cable, securing a second sensing element to a second side of the pad material, where the first side of the pad material opposes the second side, electrically connecting a second electrically conductive patch to the second sensing element, and electrically connecting a second conductor of the multiconductor cable to the second electrically conductive patch.

The above summary is not intended to describe each disclosed embodiment or every implementation of the present invention. The figures and the detailed description which follow more particularly exemplify illustrative embodiments.

BRIEF DESCRIPTION OF THE DRAWINGS

The present invention will be further explained with reference to the drawing figures listed below, where like structure is referenced by like numerals throughout the several views.

While the above-identified figures set forth several embodiments of the invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention.

DETAILED DESCRIPTION

The present invention is a sensor assembly including a sensing element, a flexible multiconductor cable, and an electrically conductive patch, where the electrically conductive patch electrically connects the sensing element and a conductor of the cable. The electrically conductive patch is positioned between the cable and the sensing element. The cable may be used to connect the sensing element to an ECU. The present invention is also a method of forming the inventive sensor assembly. Although the present invention is described in reference to a vehicle seat, other applications of the present invention in which it may be desirable to gather information about the position, orientation, presence, or size of a person within a defined space are also contemplated.

A flexible multiconductor cable in accordance with the present invention is preferably a flexible flat cable. A "flat cable" is a cable including a plurality of mutually insulated conductors, where the cable preferably has generally flat top and bottom surfaces and a non-cylindrical cross-section. The conductors are preferably aligned in a common plane than being grouped together or around a common axis to form a circular cross-section. The conductors are typically bound together (while being aligned in a common plane), which may increase the structural integrity and strain relief capabilities of the flat cable. The conductors may be any suitable shape, such as round or flat. Although a cable having a cylindrical cross-section may be used with the present invention, a flat cable is preferred because such a cable may be a more efficient use of space and a flat cable may be more comfortable to a vehicle occupant sitting on the vehicle seat.

A flat cable may also be preferred because of the substantially constant spacing between the conductors. That is, the spacing between the conductors of the flat cable remains substantially consistent because of the insulation material separating the conductors. The substantially constant spacing may increase the ability of an ECU, which is connected to the flat cable, to detect minor changes in impedance around a sensing element that is electrically connected to the flat cable. A suitable flat cable may be, but is not limited to, what is commonly referred to as a "ribbon" cable, which includes round conductors aligned parallel in a plane. The present invention may also reduce the number of individual wires required to connect the sensors to the ECU and simplify the connection process because a single cable having a plurality of mutually insulated conductors may be used.

A sensing element is connected to a conductor of the cable using a conductive patch, which is positioned between the cable and sensing element. Preferably, each sensing element is electrically connected to a separate conductive patch and a separate conductor of the multiconductor cable so that the ECU is able to gather information from individual sensing elements. Any suitable sensing element may be used with the present invention. For example, the sensing element may be formed of an electrode antenna, as described in U.S. Pat. No. 6,683,583, entitled, "FLEXIBLE ELECTRODE ANTENNA", and assigned to 3M Innovative Properties Company, St. Paul, Minn. Typically, more than one sensing element is used in the sensor assembly of the present invention (in a "sensor array"). If the sensor array is used in conjunction with a pad material (e.g., a foam mat), it may be desirable for sensors to be arranged on two opposing sides of the pad material. The positioning of each sensing element in the array may vary depending upon the type of vehicle the sensor assembly is used in, or the particular application of the sensor assembly (e.g., whether the sensor assembly is being used to activate front air bags, side air bags, etc. . . . ).

As described below, the sensing element may be secured to a conductive patch using a suitable means, such as an adhesive. In embodiments where the sensing element is adjacent to the flat cable of the sensor assembly, the sensing element and flat cable may be secured together using a transfer adhesive (which is preferably nonconductive). Other suitable means may also be used to connect the flat cable and sensing element together. The adhesion of the flat cable to the sensing element may provide more rigidity and therefore, integrity, to the sensor assembly than if the flat cable and sensing element were not adhered together, and the added rigidity may be preferable it adds to the integrity to the sensor assembly.

The conductive patch may be formed out of a conductive material. The conductive patch may be electrically conductive in either orthogonal x-y-z coordinate directions (see coordinates shown in FIG. 1) or in the z-coordinate direction. Examples of suitable materials for forming a conductive patch include, but are not limited to, a metallized nonwoven material (e.g., Product No. 9713, which is made commercially available by 3M Company, St. Paul, Minn.), a double-sided conductive tape (e.g., Product No. 1182, which is made commercially available by 3M Company, St. Paul, Minn.), a conductive transfer adhesive, and a conductive carbon nonwoven material (Product No. 9712, which is made commercially available by 3M Company, St. Paul, Minn.).

A conductive patch provides a range of electrical connectivity points for the sensing element and conductor because it provides a relatively large target conductive surface for the conductor relative to the sensor. As a result, alignment of the sensing element and conductor is not as critical as in known connection methods. In this way, the conductive patch helps a single manufacturing process be applicable to a broad range of vehicle seats rather than being specific to a particular type of vehicle seat. The conductive patch may also simplify the process for connecting the sensing element to the conductor of the cable by enlarging the range of connectivity points, and because a separate eyelet and rivet connection step between a wire and sensor is no longer required. The conductive patch may have an adhesive on one side or both opposing sides in order to help secure the conductor to the conductive patch, and/or to help secure the sensing element to the conductive patch. For example, the conductive patch may be die cut from a roll of conductive material lined with an adhesive, such as a pressure sensitive adhesive. In one embodiment, the adhesive may be conductive.

When used in conjunction with a pad material, such as a foam mat or any other suitable cushioning material, the present invention may be characterized as a "sensor mat assembly." The sensor mat assemblies described below include a foam mat. However, one skilled in the art may substitute a suitable pad material for the foam mat (e.g., resiliently deformable), depending upon the particular application of the sensor mat assembly. The foam mat may be a formed out of a polyurethane foam, or it may be formed out of one or more layers of foam having varying thicknesses and varying densities. The different layers may then be adjusted to a desired comfort level, or other vehicle-specific parameters. The foam mat may be part of a vehicle seat assembly.

A sensor assembly or a sensor mat assembly in accordance with the present invention may have a substantially liquid impervious, vapor permeable material covering at least a part of the sensor assembly, as described in U.S. patent application Ser. No. 10/196,997, entitled "BREATHABLE MOISTURE BARRIER FOR AN OCCUPANT SENSING SYSTEM" and filed on Jul. 16, 2002.

In embodiments where the foam mat, or other pad material, is adjacent to the flat cable of the sensor assembly, the foam mat and flat cable may be secured together using an adhesive. For example, a transfer adhesive may be applied to opposing sides of a cable, where one side of the cable adheres to the foam mat, and the opposing side of the cable may adhere to a substantially liquid impervious, vapor permeable material. The rigidity and integrity of the sensor assembly may increase when the flat cable is adhered (or otherwise secured) to the foam mat and substantially liquid impervious, vapor permeable material.

The figures are not drawn to scale. If drawn to scale, each flat cable would be much thinner (i.e., have a smaller z-coordinate dimension), because it is preferred that the flat cable have a small thickness as compared to the thickness of a foam mat so that the flat cable has a low profile relative to the foam mat and does not itself protrude from the mat or cause the foam mat to protrude. As used herein (see FIG. 2), a "length" runs along the x-coordinate direction, a "width" runs along the y-coordinate direction, and a "thickness" runs along the z-coordinate direction.

Figure 1:
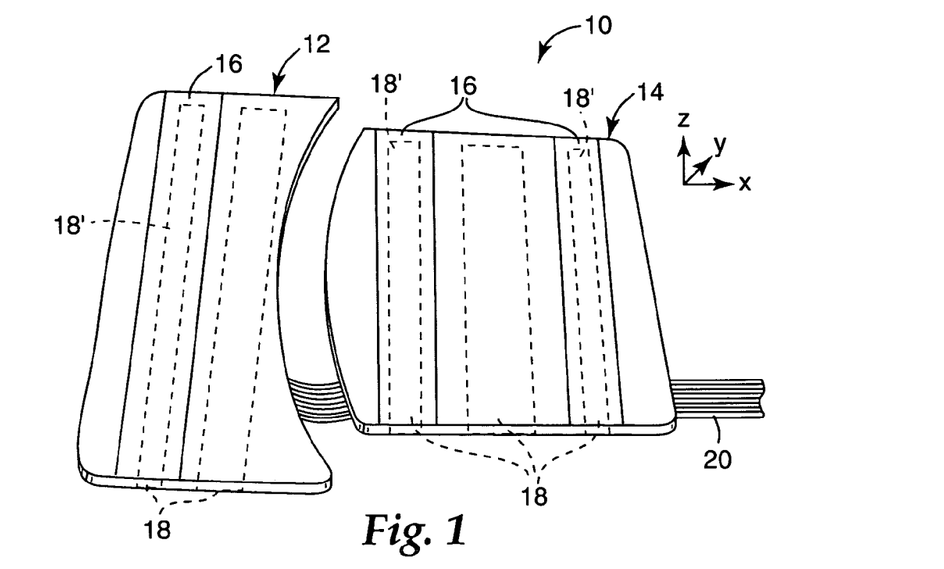
FIG. 1 is a perspective view of a sensor mat assembly in accordance with the present invention, where a sensor array is arranged on opposing sides of a foam mat and a flat cable positioned between layers of foam.

FIG. 1 is a perspective view of a sensor mat assembly 10 in accordance with the present invention. Sensor mat assembly 10 shows a general structure of a sensor mat assembly of the present invention which may be incorporated into a vehicle seat. Sensor array 12 is arranged on opposing sides of foam mat 14. Sensor array 12 is formed of a plurality of sensing elements, where a first set of sensing elements 16 is arranged on one side of foam mat 14, while a second set of sensing elements 18 (shown in phantom) is arranged on an opposing side of foam mat 14. Sensing elements 18 may optionally include one or more sensors $18^1$ which may be used to determine a thickness of foam mat 14. Sensors $18^1$ thereby act as calibration sensors, which adjust an algorithm used by the ECU for interpreting impedance changes in each sensor. The algorithm is adjusted according to changes in the thickness of foam mat 14.

Each sensing element in first and second sets of sensing elements 16 and 18 is electrically connected to an ECU (not shown in FIG. 1) using flat cable 20. Flat cable 20 is formed of a plurality of longitudinally-extending (i.e., extending in the x-coordinate direction) conductors insulated from each other by an insulating material. Preferably, each sensing element in sensor array 12 is electrically connected to a separate conductor in flat cable 20. Flat cable 20 is positioned between layers of foam, which form foam mat 14. Foam mat 14 may be secured to at least part of cable 20 using a suitable means, such as an adhesive, thermal bonding, or a mechanical attachment.

As FIG. 1 shows, flat cable 20 does not protrude significantly in the z-coordinate direction from foam mat 14, thereby adding to occupant comfort (when the occupant is sitting on a vehicle seat that includes sensor mat assembly 10). In current methods of connecting a sensing element to a wire using an eyelet and rivet connection, the sensing element does not typically run the width of the foam mat because the eyelet and rivet connection is typically connected to one end of sensing element, and that end of the sensing element is then positioned off to one side of the foam mat (so that it is no longer centered on the foam mat) so as not to cause discomfort to a vehicle occupant. In the present invention, the size of each sensing element may be increased because each sensing element of flat cable 20 may be run between foam mat 14 or be positioned underneath foam mat 14, and each sensing element in first and second sets of sensing elements 16 and 18 (and optional calibration sensors $18^1$) may run the width of foam mat 14, and are able to be centered on foam mat 14 (if it is desired). An increased sensing element size may increase the sensitivity of sensor mat assembly 10.

Sensor mat assembly 10 is just one particular embodiment of a sensor mat assembly of the present invention. In alternate embodiments (discussed, for example, in reference to FIGS. 4 and 7), flat cable 20 may be positioned on the outside of foam mat 14, rather than between layers of foam. Furthermore, flat cable 20 may be positioned on a single side of foam mat 14 or may run along the outer perimeter of foam mat 14.

Figure 2:
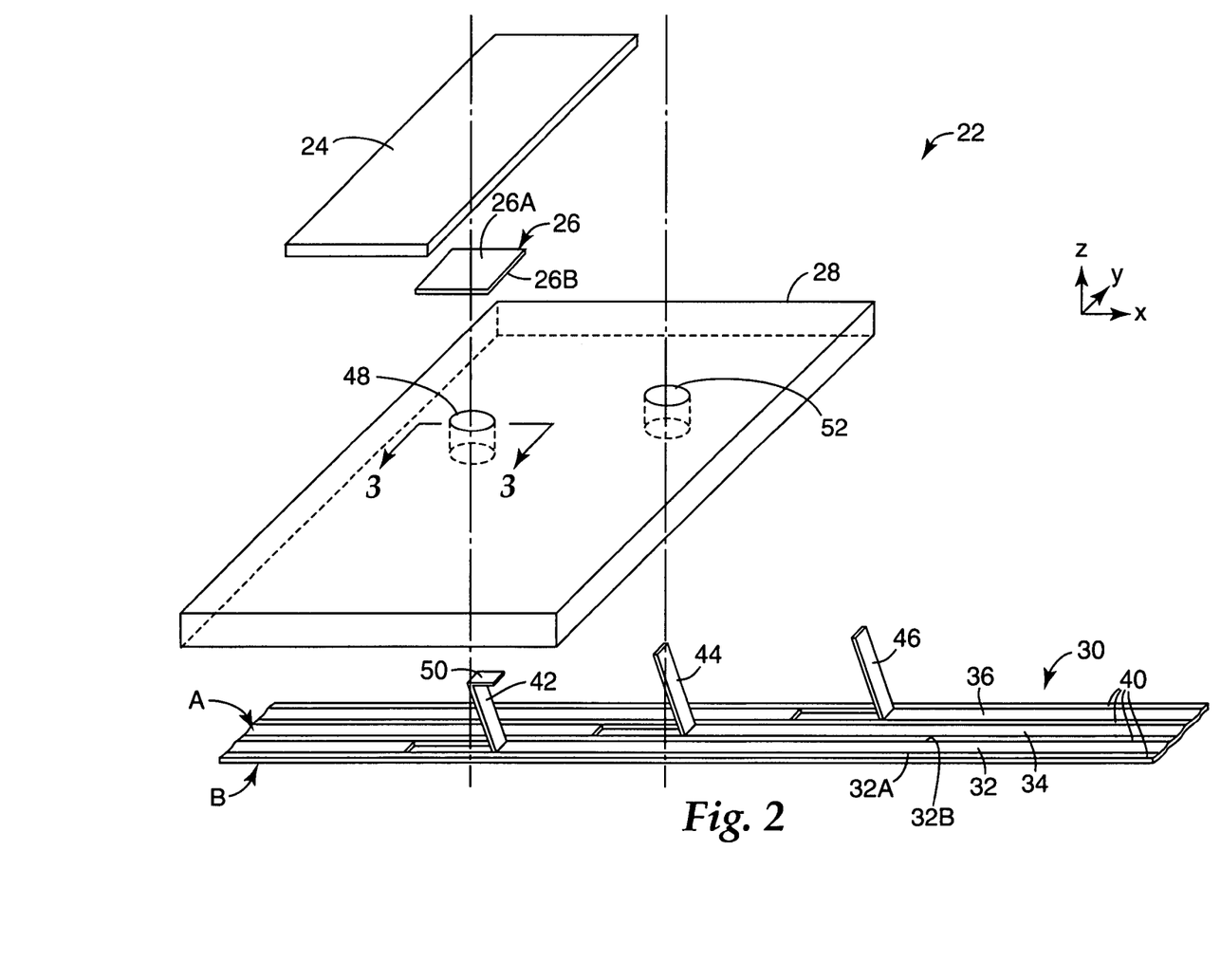
FIG. 2 is an exploded perspective view of a first exemplary embodiment of a sensor mat assembly in accordance with the present invention, where a foam mat is positioned between a flat cable and a sensing element.

FIG. 2 is an exploded perspective view of a first exemplary embodiment of sensor mat assembly 22 in accordance with the present invention. Sensor mat assembly 22 includes sensing element 24, conductive patch 26, foam mat 28, and flat cable 30. Foam mat 28 may be secured to at least part of cable 30 using a suitable means, such as an adhesive, thermal bonding, or a mechanical attachment. Sensing element 24 and cable 30 may also be secured together using an adhesive, or another suitable means, in order to increase the rigidity of sensor mat assembly 90.

Conductive patch 26 is used to electrically connect conductor 32 of flat cable 30 to sensing element 24. The inventive means of electrically (and in some embodiments, physically) connecting conductor 32 of flat cable 30 to conductive patch 26 will be discussed in detail below. Conductive patch 26 is formed of a conductive material which may be conductive in either orthogonal x-y-z coordinate directions (see coordinates shown in FIG. 2), or in the z-coordinate direction. In general, conductive patch 26 should be large enough to provide relatively small flat cable 30 with a large area for potential contact.

Conductive patch 26 is preferably small enough so that it does not contact an adjacent conductive patch (not shown in FIG. 2) or sensing element (not shown in FIG. 2), which could interfere with the ECU's ability to gather information from each sensing element separately. For example, conductive patch 26 may be formed so that it is no longer than sensing element 24 (i.e., conductive patch 26 preferably has an x-coordinate dimension less than or equal to the x-coordinate dimension of sensing element 24) and so that it has a smaller width (i.e., a y-coordinate dimension) than sensing element 24. As FIG. 2 shows, rather than having to connect to sensing element 24 at exactly one particular point (e.g., when using an eyelet and rivet connection means), conductive patch 26 provides a large range or area of possible connectivity points for a conductor (e.g., first conductor 32) to contact, thus requiring less precision in the assembly process of sensing element 24 and cable 30.

Sensing element 24 may be electrically connected and secured to conductive patch 26 using an adhesive. However, any suitable connection and securing means may also be used. Sensing element 24 and conductive patch 26 may then be secured to foam mat 28 using a pressure sensitive adhesive, or any other suitable securing means. For example, conductive patch 26 may comprise two opposed adhesive sides 26A and 26B, where adhesive side 26A adheres conductive patch 26 to sensing element 24 and adhesive side 26B adheres conductive patch 26 to tab 42.

Flat cable 30 preferably has a small thickness (measured in the z-coordinate direction) so that foam mat 28 does not protrude in the z-coordinate direction where flat cable 30 is located. Such a protrusion may cause discomfort to an occupant who is sitting on a vehicle seat that incorporates sensor mat assembly 22. As seen in exemplary FIG. 2, flat cable 30 is formed of first conductor 32, second conductor 34, and third conductor 36, where conductors 32, 34, and 36 are aligned parallel in the y-coordinate direction and separated from one another by insulating material 40. Preferably, cable 30 also has an insulating material 41 (shown FIGS. 3A and 3B) on opposing sides A and B to electrically insulate cable 30, but such portions of insulating material 40 have been removed from FIG. 2 for clarity of illustration. Each conductor 32, 34, and 36 extends in a longitudinal direction (i.e., the x-coordinate direction). Tabs 42, 44, and 46 are apart of each of the conductors 32, 34, and 36, respectively. Each tab 42, 44, and 46 preferably connects to a separate sensing element, so that the ECU is able to determine the impedance changes of each sensing element in the sensor array of sensor mat assembly 22.

Figure 3A:
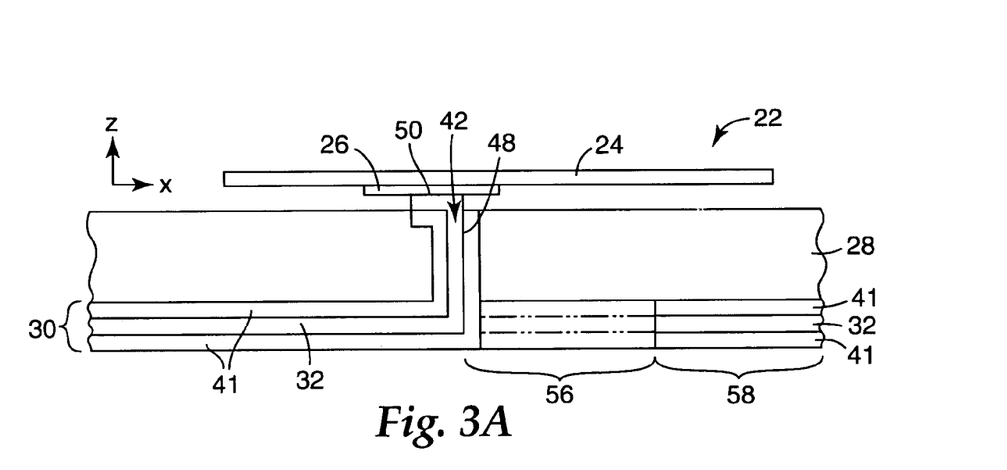
FIG. 3A is a schematic sectional view of the sensor mat assembly of FIG. 2, as assembled and taken along lines 3-3.
Figure 3B:
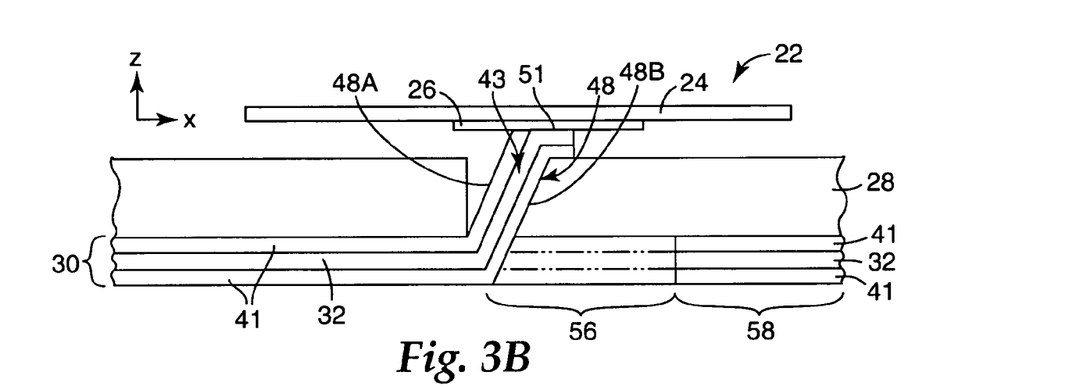
FIG. 3B is a schematic sectional view of the sensor mat assembly of FIG. 2, as assembled and taken along lines 3-3, where an opening in the foam mat has an inclined wall.

Tab 42 may be formed by first cutting conductor 32 in a substantially lateral direction (i.e., in the y-coordinate direction) to a desired width of tab 42, where the desired width is preferably no wider than the width of conductor 32, but the width may also include a part of insulating material 40 which is adjacent either side of conductor 32. Next, cable 30 may be cut adjacent conductor 32 along a substantially longitudinal direction (i.e., in the x-coordinate direction) to a desired length of tab 42. Specifically, part of insulation material 40 which is adjacent opposing sides 32A and 32B of conductor 32 may be cut longitudinally so that tab 42 includes insulation material 40, or cable 30 may be cut longitudinally at sides 32A and 32B, where insulation material 40 and conductor 32 contact one another, so that tab 42 has little to no insulation material 40 (however, that tab 42 may still have some insulation material 41, as shown in FIGS. 3A and 3B). Preferably, at least some insulation material 40 remains between conductor 34 and conductor 32 and tab 42 so that conductor 34 remains electrically insulated therefrom. Tab 42 may be cut using any suitable cutting means, such as a mechanical cutting means or a laser cutting means. Tab 42 is then bent relative to cable 30 to project (or "protrude") outwardly therefrom.

In the first exemplary embodiment, tab 42 is of sufficient length to extend through opening 48 in foam mat 28 to physically contact conductive patch 26. Tab 42 is bent so that contact surface 50 of tab 42 contacts conductive patch 26. At least contact surface 50 of tab 42, which is to contact conductive patch 26, is stripped of its insulating layers 41 (shown in FIGS. 3A and 3B), such as by using a laser, heat, mechanical abrasion, or any other suitable means. However, all of tab 42 may also be stripped of its insulating layer. It may be preferred to leave some insulating material 41 on tab 42 because tab 42 may be more rigid. In addition, it may be preferred to leave some insulating material 41 on tab 42 from a manufacturing aspect, because then less insulating material 41 needs to be removed.

Tabs 44 and 46 may be formed in the same way as tab 42. Just as tab 42 extends through opening 48 in foam mat 28, tab 44 may extend through opening 52 in foam mat 28 to physically contact a conductive patch (similar to conductive patch 26 and not shown in FIG. 2), where the conductive patch is connected to a sensing element (similar to sensing element 24 and not shown in FIG. 2). Tab 44 may also be bent like tab 42 in order to provide a surface to contact the conductive patch. Although a corresponding opening is not shown for tab 46, tab 46 may also extend through foam mat 28 to contact a conductive patch. In alternate embodiments, tabs 42, 44, and 46 may be formed to be a different shape than that shown in FIG. 2, for example, by not cutting conductor 32 and cable 30 in substantially lateral and longitudinal directions.

Openings 48 and 52 are formed in foam mat 28 using any suitable method, such as a laser cutting method. Openings 48 and 52 are wide enough to accommodate tabs 42 and 44, respectively. In alternate embodiments, foam mat 28 may not have any openings because tabs 42 and 44 may be rigid enough to move through foam mat 28 without the assistance of a precut opening. A substantially liquid impervious, vapor permeable material may be placed over at least a part of sensor mat assembly 22. The substantially liquid impervious, vapor permeable material may be applied in more than one piece to sensor mat assembly 22, where the seams are secured using a suitable means, such as heat sealing the pieces together or adhering the edge of the pieces together using an adhesive.

FIG. 3A is a partial schematic sectional view of sensor mat assembly 22 of FIG. 2 as assembled and taken along line 3-3. Tab 42 of conductor 32 extends through opening 48 in foam mat 28 to contact conductive patch 26, thereby creating an electrical connection between conductor 32 and sensing element 24. Insulating material 41 is shown to be on sides A and B (as shown in FIG. 2) of cable 30.

Figure 8:
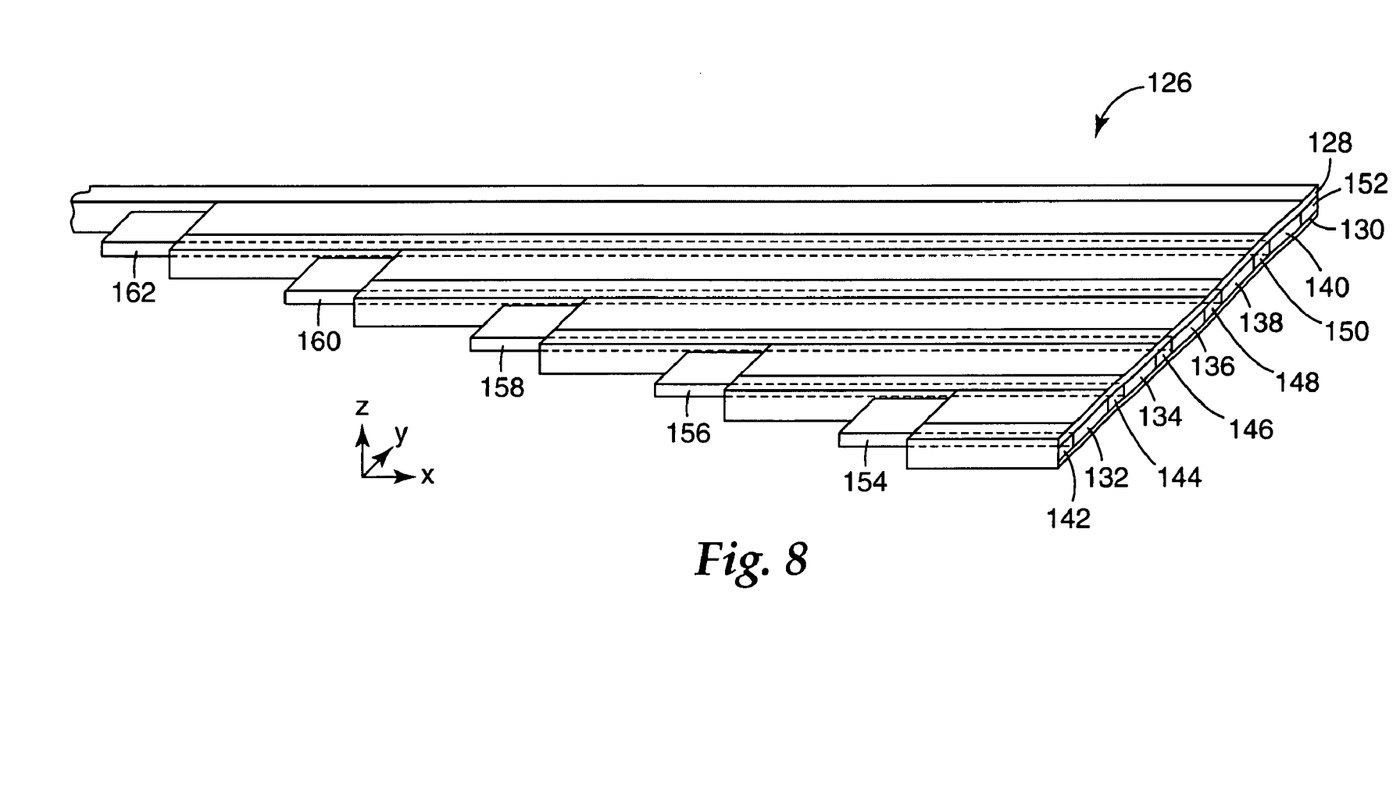
FIG. 8 is a perspective view of an alternate embodiment of a flat cable that may be used in accordance with the present invention, where the unused portions of each conductor are removed from the flat cable.

Conductors 44 and 46 (shown in FIG. 2) of flat cable 30 are not shown in FIG. 3 because from the side view, conductors 34 and 36 are behind conductor 32 (when viewing the image). Flat cable 30, and therefore conductor 32, is connected to an ECU (not shown in FIG. 3). Conductor 32 has a gap 56 where tab 42 was cut out. Gap 56 does not necessarily need to be completely through cable 30 because a part of insulating layer 41 may be left in gap 56. Portion 58 of conductor 32 and insulating layer 41 that is cut off from conductor 32 is essentially "dead wire" because it is no longer connected to the ECU and in one embodiment, portion 58 may be removed from flat cable 30 (as shown in FIG. 8).

FIG. 3B is a partial schematic sectional view of sensor mat assembly 22 as assembled and taken along lines 3-3, where opening 48 has inclined sidewall 48B rather than a cylindrical shape as in FIGS. 2 and 3A. Tab 43 is bent in an opposite direction than tab 42 of FIGS. 2 and 3A so that contact surface 51 extends to the right of tab 43. At least one sidewall 48B of opening 48 is inclined while sidewall 48A (and other sidewall portions) may run along the z-coordinate (straight up and down) as shown. Tab 42 may then be positioned along inclined sidewall 48B so that tab 42 extends through foam mat 28 at an obtuse angle (where the angle is measured between tab 42 and the part of cable 30 to which tab 42 is still connected). When sensor mat assembly 22 is used in a vehicle, a load (e.g., a person sitting on a vehicle seat) may be applied to the top surface of sensing element 24. An inclined sidewall and tab may help to distribute the pressure of the load better than with a sidewall and tab that run straight up and down in the z-coordinate direction. The inclined sidewall of opening 48 in FIG. 3B may also be implemented into any sensor mat assembly of the present invention, including the exemplary embodiments discussed below.

In alternate embodiments, sidewall 48A and other sidewall portions may also be angled. If sidewall 48A is angled, tab 42 may be positioned along sidewall 48A such that there is an acute angle between tab 42 and the part of cable 30 to which tab 42 is still connected. However, in that particular embodiment, there may be more stress on tab 42 (particularly where conductor 32 is bent to form tab 42, where tab 42 and the rest of conductor 32 meet) from an applied load than with the exemplary embodiment including tab 42 positioned along sidewall 48B at an obtuse angle.

Figure 4:
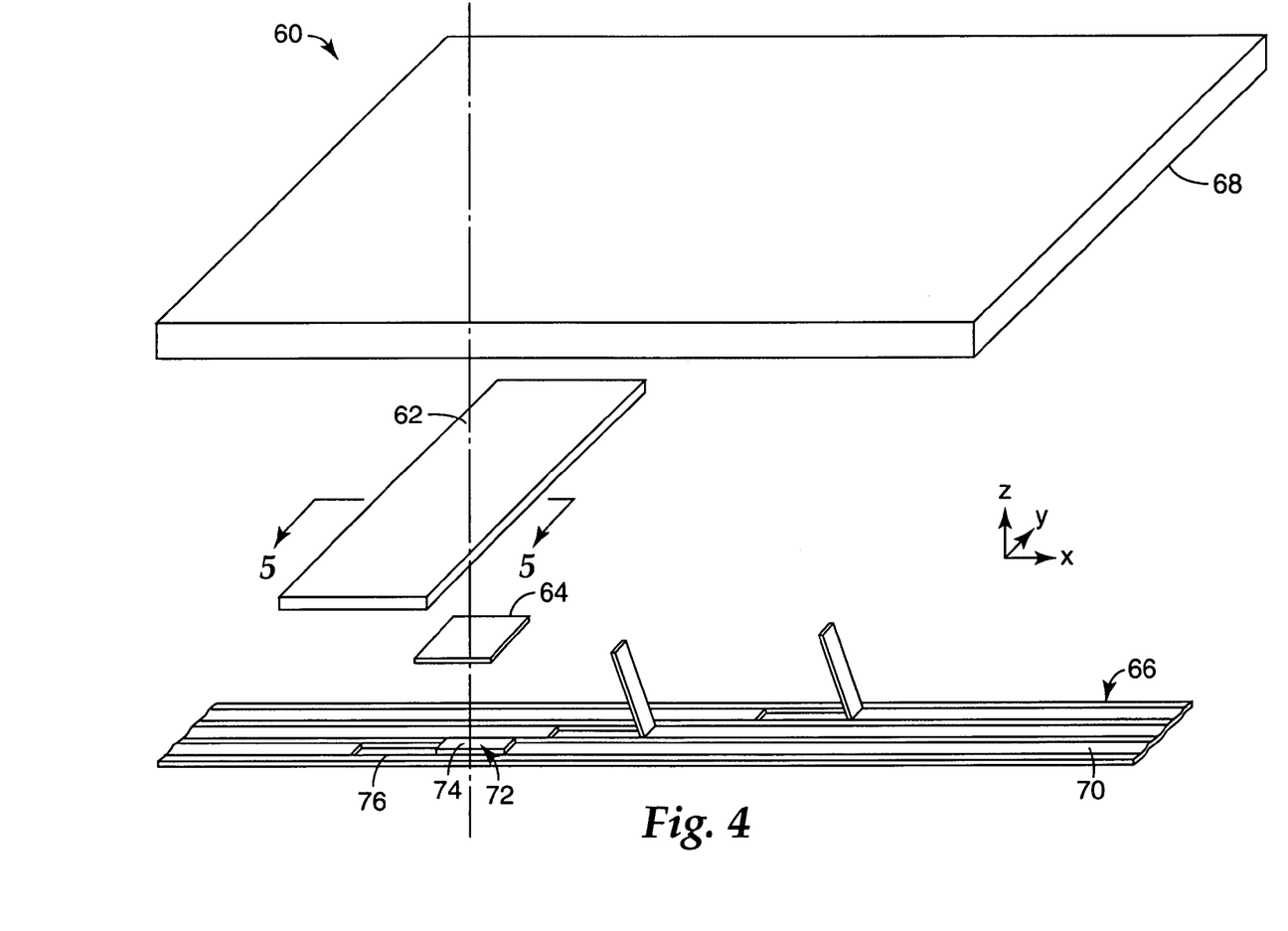
FIG. 4 is an exploded perspective view of a second exemplary embodiment of a sensor mat assembly in accordance with the present invention, where a flat cable and a sensing element are positioned on the same side of a foam mat.

FIG. 4 is an exploded perspective view of a second exemplary embodiment of sensor mat assembly 60 in accordance with the present invention. Sensor mat assembly 60 includes sensing element 62 (similar to sensing element 24 of FIG. 2), conductive patch 64 (similar to conductive patch 26 of FIG. 2), flat cable 66 (similar to flat cable 30 of FIG. 2), and foam mat 68 (similar to foam mat 28 of FIG. 2). Just as with the first exemplary embodiment, flat cable 66 and sensing element 62 may be secured together using an adhesive, or another suitable means, in order to increase the rigidity of sensor mat assembly 60. Sensing element 62 is secured to foam mat 68 using any suitable means, such as, for example, a pressure sensitive adhesive. As with conductive patch 26, conductive patch 64 is preferably small enough to not contact an adjacent sensing element and/or conductive patch, and in this exemplary embodiment, an adjacent tab of an adjacent conductor. Rather than extending through foam mat 68 as in the first exemplary embodiment, flat cable 66 is positioned on the same side of foam mat 68 as sensing element 62 and conductive patch 64.

Tab 72 is formed from conductor 70 of flat cable 66 using a method similar to that described in reference to tab 42 of FIG. 2. Rather than projecting outwardly from conductor 70 (as tab 42 projects from conductor 32 in FIG. 2), tab 72 is folded in the x-coordinate direction so that it is bent back over conductor 70. Folding tab 72 in this way may create a spring-like force because tab 72 may naturally want to move away from flat cable 66 and towards gap 76. An exposed contact surface 74 on tab 72 is thus aligned to contact (physically and electrically) conductive patch 64. The spring-like force of tab 72 applies an opposing force on conductive patch 64. If conductive patch 64 and tab 72 are connected using an adhesive, the spring-like action may help reinforce the adhesion between tab 72 and conductive patch 64. Conductive patch 64 is secured to sensing element 62 using an adhesive, or other suitable means. In this way, conductor 70 (and therefore, the ECU electrically connected to flat cable 66) is electrically connected to sensing element 62.

Figure 5:
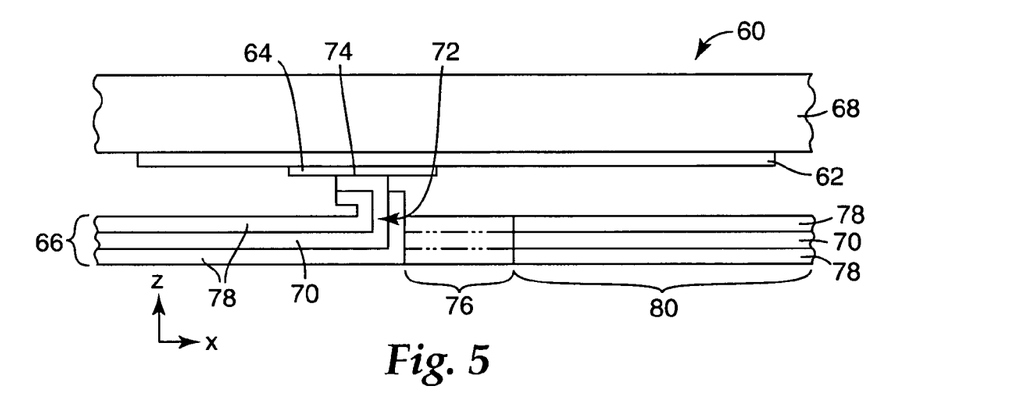
FIG. 5 is a schematic sectional view of the sensor mat assembly of FIG. 4, as assembled and taken along lines 5-5.

FIG. 5 is a partial schematic sectional view of sensor mat assembly 60 of FIG. 4 as assembled and taken along line 5-5. Sensing element 62 and conductive patch 64 are secured to foam mat 68 using any suitable means, such as a pressure sensitive adhesive. Contact surface 74 of tab 72 of conductor 70 contacts conductive patch 64, thereby creating an electrical connection between conductor 70 and sensing element 62. Flat cable 66 is secured to conductive patch 64 using a pressure sensitive adhesive. Any other suitable securing means may also be used. Flat cable 66, and therefore conductor 72, is connected to an ECU (not shown in FIG. 3). Conductor 70 of flat cable 66 is positioned between insulating layers 78. As with conductor 32 of FIG. 4, gap 76 in flat cable 66 indicates where tab 72 was formed. In an alternative embodiment, portion 80 of conductor 70 and insulating layers 78 that have been separated from tab 72 may be removed from flat cable 66 (as shown in FIG. 8).

Figure 6:
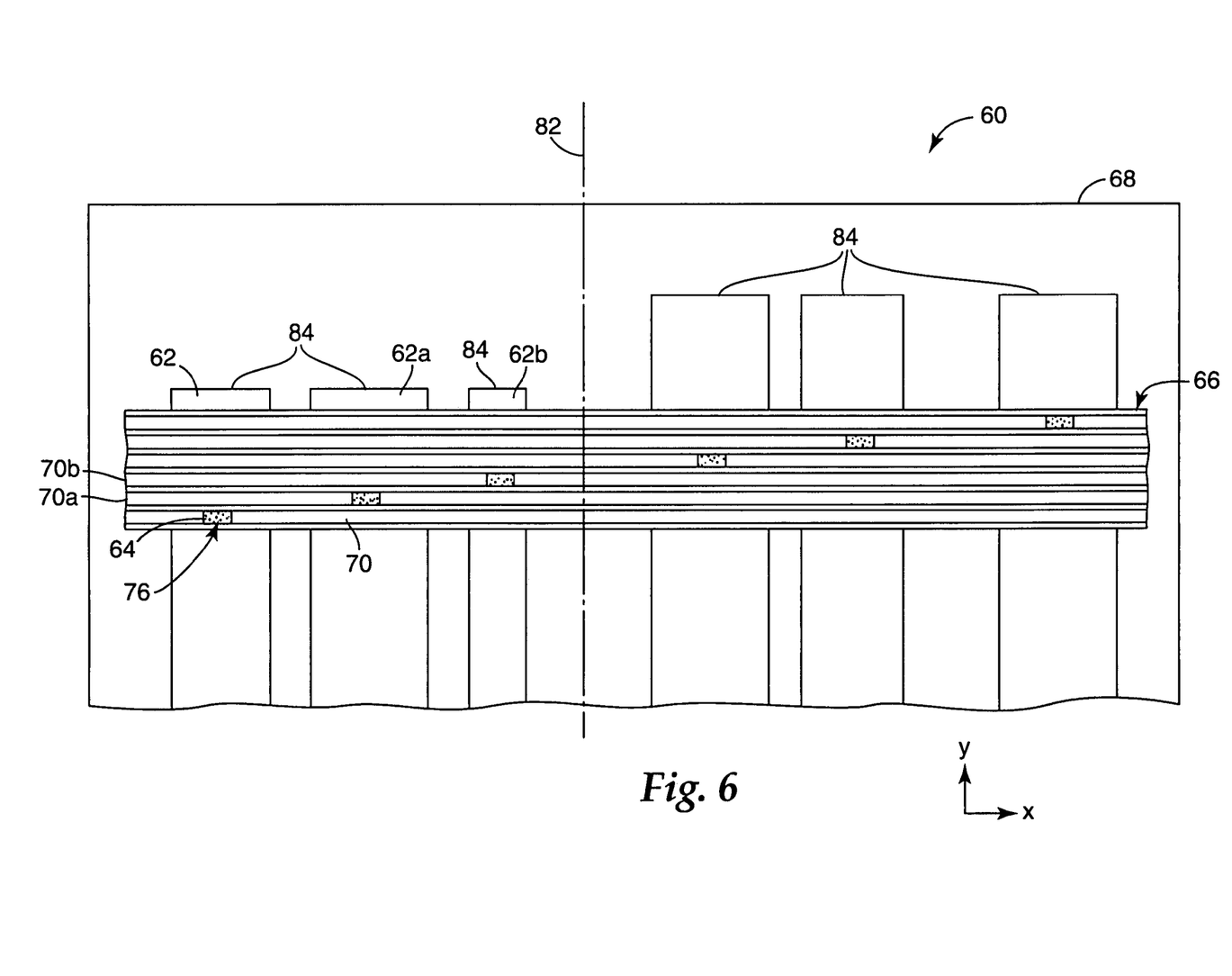
FIG. 6 is a bottom view of the sensor mat assembly of FIG. 4 as assembled, from the view shown in FIG. 4, where a plurality of sensing elements are arranged on the foam mat.

FIG. 6 is a bottom view of sensor mat assembly 60 as assembled, where the view is that of the underside of sensing element 62, conductive patch 64, cable 66, and foam mat 68 (where the topside of each are shown in FIG. 4). Sensor array 84 now includes six sensing elements, which are each electrically connected to flat cable 66, but any suitable number of sensing elements may be used. Gap 76 in flat cable 66 where tab 72 (shown in FIGS. 4 and 5) was cut out of conductor 70 and insulating layers 78 can be seen. The stippled portion shown in gap 76 represents conductive patch 64, which is positioned between flat cable 66 and sensing element 62. The conductor in flat cable 66 which is connected to each sensing element in sensor array 84 has a corresponding gap where a tab was formed to electrically connect that conductor of flat cable 66 to its respective sensing element. As FIG. 6 shows, each sensing element in sensor array 84 connects to a different conductor in flat cable 66 (e.g., conductor 70 is connected to sensing element 62, conductor 70a is connected to sensing element 62a, conductor 70b is connected to sensing element 62b, and so forth).

When sensor mat assembly 60 is later incorporated into a vehicle seat, foam mat 68 may be folded along line 82, so that flat cable 66 is positioned between two layers of foam mat 68 (e.g., sensor mat assembly 10 shown in FIG. 1). Alternately, sensor mat assembly 60 may be folded the opposite way along line 82 so that flat cable 66 is on the outside of foam mat 68 and runs along part of the outer perimeter of foam mat 68. Sensor mat assembly 60 may then be die cut using a laser or other suitable means to a desired size and shape. A substantially liquid impervious, vapor permeable material may then be placed over at least a part of sensor mat assembly 60, as described in reference to sensor mat assembly 22.

Figure 7:
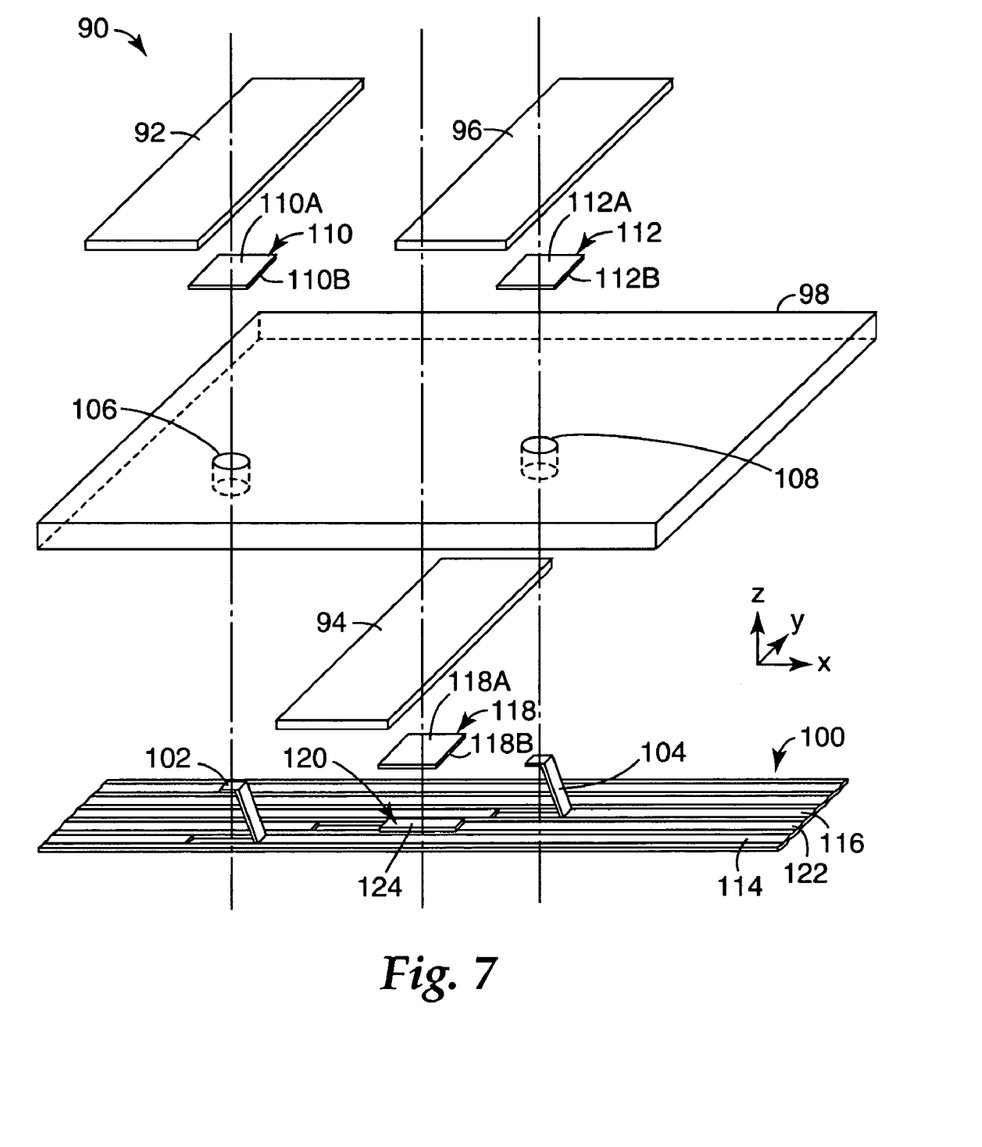
FIG. 7 is an exploded perspective view of a third exemplary embodiment of a sensor mat assembly in accordance with the present invention, which combines aspects of the first and second exemplary embodiments.

FIG. 7 is an exploded perspective view of a third exemplary embodiment of sensor mat assembly 90, which combines aspects of the first and second exemplary embodiments. In FIG. 7, sensing elements 92, 94, 96 are positioned on opposing sides of foam mat 98, but flat cable 100 is only on one side of foam mat 98. The embodiment shown in FIG. 7 allows sensing elements 92, 94, 96 to be positioned on opposing sides of foam mat 98 without having to wrap flat cable 100 around foam mat 98, which is allows less flat cable 100 to be used in sensor mat assembly 90.

Sensing elements 92 and 96 are electrically connected to flat cable 100 using aspects of the first exemplary embodiment. Tabs 102 and 104 from conductors 114 and 116, respectively, of cable 100 project through openings 106 and 108, respectively, in foam mat 98 in order to contact conductive patches 110 and 112, respectively. An electrical connection is then formed between conductor 114 and sensing element 92, and a separate electrical connection is formed between conductor 116 and sensing element 96. Conductive patch 110 has adhesive on opposed sides 110A and 110B in order to secure conductive patch 110 to sensing element 92 and tab 102, respectively. Similarly, conductive patch 112 has adhesive on opposed sides 112A and 112B in order to secure conductive patch 112 to sensing element 96 and tab 104, respectively. Other suitable securing means may also be used. Conductive patches 110 and 112 are preferably small enough so as not to contact each another and so as not to contact adjacent sensing elements 96 and 92, respectively. Openings 106 and 108 are formed in foam mat 98 using a suitable method, such as a laser cutting method. Again, openings 106 and 108 may not be necessary and tabs 102 and 104 may extend directly through foam mat 98 rather than through precut openings 106 and 108.

Sensing element 94 is electrically connected to flat cable 100 using aspects of the second exemplary embodiment, since sensing element 94 and conductive patch 118 are located on the same side of foam mat 98 as cable 100. Thus, tab 120 does not need to project through foam mat 98. Rather, tab 120 is bent backwards (in the x-coordinate direction) in order to form a contact surface 124, which contacts conductive patch 118, thereby creating an electrical connection between conductor 122 and sensing element 94 (which is electrically connected to conducive patch 118). Conductive patch 118 has adhesive on opposed sides 118A and 118B in order to securably connect to sensing element 94 and contact surface 124 of tab 120, respectively. Other suitable means of securing conductive patch 118 to sensing element 94 and contact surface 124 of tab 120 may also be used. When tab 120 is folded onto conductor 122 as shown in FIG. 7, it creates a spring-like action, where tab 120 applies an opposing force on conductive patch 118. This may help form a secure connection between tab 120 and conductive patch 118.

Sensing elements 92, 94, and 96 may each be secured to flat cable 100 using an adhesive, or another suitable means, in order to increase the rigidity of sensor mat assembly 90. As with the previous exemplary embodiments, a substantially liquid impervious, vapor permeable material may be placed over at least a part of sensor mat assembly 90.

As discussed earlier, that portion of a conductor of a cable which is not connected to an electronic control unit and is essentially "dead wire" may be removed after a tab is formed in the conductor. The removal of such conductor portions results in a flat cable 126 as shown in FIG. 8. Flat cable 126 is shown to have first insulating layer 128 and second insulating layer 130 positioned on opposing sides of flat cable 126. Positioned between first and second insulating layers 128 and 130, respectively, are conductors 132, 134, 136, 138, and 140, which are separated by insulating material 142, 144, 146, 148, 150, and 152. In this way, conductors 132, 134, 136, 138, and 140 are mutually insulated from one another and from exterior contacts.

Tab 154 is formed in conductor 132. As discussed earlier, tab 154 may be formed by first cutting conductor 132 in a substantially lateral direction (i.e., in the y-coordinate direction) to a desired width of tab 154, where the desired width is preferably no wider than the width of conductor 132, but may include a part of adjacent insulating material 142 and 144. A part of cable 100 may be cut along the longitudinal direction (i.e., in the x-coordinate direction) to a desired length of tab 154, such that tab 154 is able to protrude from cable 100.

Tab 154 may then be used to electrically connect conductor 132 to a conductive patch (e.g., conductive patch 26 of FIG. 2), which is electrically connected to a sensing element (e.g., sensing element 24 of FIG. 2). In order to accomplish this, the portions of tab 154 which will contact the conductive patch must be exposed (i.e., insulating material must be removed). As FIG. 8 shows, the portions of first and second insulating layer 128 and 130, respectively, which contact tab 154 have been removed using a laser, heat, mechanical abrasion, or any other suitable means. It may not be necessary to remove both first and second insulating layers 128 and 130, because only one side of tab 154 may be contacting the conductive patch. Insulating material 142 and 144 has also been removed from tab 154, but it may not be necessary to remove insulating material 142 and 144.

Rather than protruding (or "projecting") from conductor 132 (e.g., like tab 42 protrudes from conductor 32 in FIG. 2), tab 154 is at an end of conductor 132. The portion of conductor 132 to the left of tab 156 (when viewing FIG. 8) is removed because it is essentially "dead wire" since it is no longer connected to an ECU.

Tabs 156, 158, 160, and 162 may be formed at the end of conductors 134, 136, 138, and 140, respectively, using a similar method as that used to form tab 154. The "dead wire" portions of each conductor 134, 136, 138, and 140 are also removed. As a result, each conductor 132, 134, 136, 138, and 140 has a different length and the width of flat cable 126 becomes progressively smaller as each conductor 134, 136, 138, and 140 is terminated by connection to its respective sensing element. Preferably, each tab 154, 156, 158, 160, and 162 electrically and physically contacts a separate conductive patch (and therefore, a separate sensing element) so that an ECU (which is connected to flat cable 126) may gather information from each sensing element separately. Forming flat cable 126 as shown in FIG. 8 may be a more efficient use of flat cable material than using a flat cable structure like flat cable 30 of FIG. 2 because a single length of full-width flat cable may be used to form two flat cables similar to flat cable 126.

With each of the three exemplary embodiments described above, each sensor assembly (or sensor mat assembly) may be incorporated into a vehicle seat assembly. Specifically, the sensor assembly may be aligned in a recess of the vehicle seat assembly. An outer covering (such as an aesthetic covering) may then be fitted over at least part of the vehicle seat assembly, in which the sensor assembly has been placed.

In addition to being included in a bottom seat portion of a vehicle seat, a sensor assembly in accordance with the present invention may be incorporated into other portions of the vehicle seat. For example, the sensor assembly may be incorporated into a back portion of a vehicle seat or into a side portion of a vehicle seat in order to control the deployment of side air bags. A sensor assembly of the present invention may also be used in any application which may require the monitoring of the position, orientation, presence, or size of a person or object within a defined space.

The present invention also includes a method of forming the inventive sensor assembly and inventive sensor mat assembly. The sequence of the present invention's method steps is not limited to the sequence recited in the claims, unless a previously recited step is a prerequisite to completing a subsequent step. Rather, the method steps recited in the claims may be completed in any suitable order.

Although the present invention has been described with reference to preferred embodiments, workers skilled in the art will recognize that changes may be made in form and detail without departing from the spirit and scope of the invention.

The invention claimed is:

1. A sensor assembly comprising:
a sensing element;
an electrically conductive patch electrically connected to the sensing element;
a cable including a plurality of conductors; and
a substantially liquid impervious, vapor permeable material covering at least a portion of the sensing element;
wherein the electrically conductive patch is positioned between the cable and the sensing element, and wherein a conductor of the cable is electrically connected to the electrically conductive patch.

2. The sensor assembly of claim 1, and further comprising:
a pad material positioned between the electrically conductive patch and the cable.

3. The sensor assembly of claim 2, wherein the pad material is a foam material.

4. The sensor assembly of claim 2, wherein the pad material comprises a portion of a vehicle seat assembly.

5. The sensor assembly of claim 4, and further comprising an outer cover fitted over at least part of the vehicle seat assembly.

6. The sensor assembly of claim 1, wherein the cable is a flat cable, and wherein the plurality of conductors are mutually insulated.

7. The sensor assembly of claim 1, wherein the electrically conductive patch includes a metallized nonwoven material.

8. The sensor assembly of claim 1, wherein at least some of the conductors of the cable are electrically connected to an electronic control unit.

9. A sensor mat assembly comprising:
- a pad material;
- a first sensing element electrically connected to a first electrically conductive patch on a first side of the pad material;
- a second sensing element electrically connected to a second electrically conductive patch on a second side of the pad material, wherein the first and second sides of the pad material oppose one another;
- a flat cable including a first conductor and a second conductor, and wherein the first conductor is electrically connected to the first electrically conductive patch and the second conductor is electrically connected to the second electrically conductive patch; and
- a substantially liquid impervious, vapor permeable material covering at least a portion of the pad material.

10. The sensor mat assembly of claim 9, wherein the flat cable and the first sensing element are on opposing sides of the pad material.

11. The sensor mat assembly of claim 10, wherein the first conductor projects through the pad material to electrically connect to the first electrically conductive patch.

12. The sensor mat assembly of claim 9, wherein each electrically conductive patch includes a metallized nonwoven material.

13. The sensor mat assembly of claim 9, where the flat cable runs along the first side of the pad material.

14. The sensor mat assembly of claim 9, wherein the sensor assembly comprises a portion of a vehicle seat assembly.

15. A sensor assembly comprising:
- a sensing element;
- an electrically conductive patch electrically connected to the sensing element; and
- a cable including a plurality of conductors;
- wherein the electrically conductive patch is positioned between the cable and the sensing element, and wherein a conductor of the cable is electrically connected to the electrically conductive patch,
- and wherein the conductor is connected to the electrically conductive patch at an angle not orthogonal to the electrically conductive patch and not parallel to the electrically conductive patch;
- a substantially liquid impervious, vapor permeable material covering at least a portion of the sensing element.

16. The sensor assembly of claim 15, further comprising:
- a pad material positioned between the electrically conductive patch and the cable.

17. The sensor assembly of claim 16, wherein the pad material is a foam material.

18. The sensor assembly of claim 16, wherein the pad material comprises a portion of a vehicle seat assembly.

19. The sensor assembly of claim 18, and further comprising an outer cover fitted over at least part of the vehicle seat assembly.

20. The sensor assembly of claim 16, wherein the cable and the sensing element are on opposing sides of the pad material.

21. The sensor assembly of claim 20, wherein a conductor projects through the pad material to electrically connect to the electrically conductive patch.

22. The sensor assembly of claim 16, where the cable runs along a side of the pad material.

23. The sensor assembly of claim 15, wherein the cable is a flat cable, and wherein the plurality of conductors are mutually insulated.

24. The sensor assembly of claim 15, wherein the electrically conductive patch includes a metallized nonwoven material.

25. The sensor assembly of claim 15, wherein at least some of the conductors of the cable are electrically connected to an electronic control unit.

26. The sensor assembly of claim 15, wherein the sensor assembly comprises a portion of a vehicle seat assembly.

* * * * *